United States Patent
Lin et al.

(10) Patent No.: US 9,966,266 B2
(45) Date of Patent: May 8, 2018

(54) APPARATUS FOR SEMICONDUCTOR WAFER TREATMENT AND SEMICONDUCTOR WAFER TREATMENT

(71) Applicant: UNITED MICROELECTRONICS CORP., Hsin-Chu (TW)

(72) Inventors: Yu-Ying Lin, Tainan (TW); Chueh-Yang Liu, Tainan (TW); Yu-Ren Wang, Tainan (TW); Chun-Wei Yu, Tainan (TW); Kuang-Hsiu Chen, Tainan (TW); Yi-Liang Ye, Kaohsiung (TW); Hsu Ting, Tainan (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/137,010

(22) Filed: Apr. 25, 2016

(65) Prior Publication Data
US 2017/0309485 A1    Oct. 26, 2017

(51) Int. Cl.
| H01L 21/02 | (2006.01) |
| H01L 21/268 | (2006.01) |
| H01L 21/67 | (2006.01) |
| H01L 21/265 | (2006.01) |
| H01L 21/3065 | (2006.01) |
| H01L 21/306 | (2006.01) |
| H01L 21/687 | (2006.01) |
| H01L 29/66 | (2006.01) |

(52) U.S. Cl.
CPC .... *H01L 21/2686* (2013.01); *H01L 21/02057* (2013.01); *H01L 21/26513* (2013.01); *H01L 21/3065* (2013.01); *H01L 21/30604* (2013.01); *H01L 21/6708* (2013.01); *H01L 21/67051* (2013.01); *H01L 21/67115* (2013.01); *H01L 21/68785* (2013.01); *H01L 29/66575* (2013.01)

(58) Field of Classification Search
None
See application file for complete search history.

(56) References Cited

U.S. PATENT DOCUMENTS

| 2003/0192577 A1 | 10/2003 | Thakur et al. | |
| 2008/0047577 A1* | 2/2008 | Goto | B08B 3/10 134/1 |
| 2010/0003021 A1* | 1/2010 | Hirahara | H05K 3/1283 392/418 |
| 2012/0162573 A1* | 6/2012 | Takahashi | C04B 35/597 349/61 |
| 2012/0211024 A1 | 8/2012 | Dietze et al. | |
| 2013/0319982 A1* | 12/2013 | Frankel | B23K 26/032 219/121.72 |
| 2014/0248782 A1* | 9/2014 | Ishibashi | B24B 37/10 438/746 |
| 2015/0264790 A1* | 9/2015 | Miyagi | G03F 1/82 378/66 |

\* cited by examiner

Primary Examiner — Seahvosh Nikmanesh
Assistant Examiner — Xiaoming Liu
(74) Attorney, Agent, or Firm — Winston Hsu

(57) ABSTRACT

An apparatus for semiconductor wafer treatment includes a wafer holding unit configured to receive a single wafer, at least a solution supply unit configured to apply a solution onto the wafer and an irradiation unit configured to emit irradiation to the wafer. The irradiation unit further includes at least a plurality of first light sources configured to emit irradiation in FIR range and a plurality of second light sources configured to emit irradiation in UV range.

10 Claims, 5 Drawing Sheets

APPARATUS FOR SEMICONDUCTOR WAFER TREATMENT AND SEMICONDUCTOR WAFER TREATMENT

BACKGROUND OF THE INVENTION

1. Field of the Invention

The present invention relates to an apparatus for semiconductor wafer treatment and a semiconductor wafer treatment, more particularly, to an apparatus for semiconductor wafer treatment and a semiconductor wafer treatment adopting wet processing.

2. Description of the Prior Art

In semiconductor device fabrication, many etching process steps are performed. Etching process refers to a process of removing predetermined portions of material by wet etching, i.e., removal of material via application of a chemical, or by dry etching, i.e., removal of material via plasma. As opposed to dry etching, wet etching may be isotropic, i.e., removal of material in all directions at the same rate, thereby being suitable for use in three-dimensional devices, e.g., metal wiring or contact holes in a semiconductor device. For example, portions of an oxide layer may be etched to form and/or to expose active regions, e.g., source/drain regions, gate regions, and so forth, on a semiconductor substrate.

Another important task in semiconductor device fabrication is the cleaning for preparation of the wafer for further processing. Cleaning process refers to a process of removing contaminants such as particles from the wafer surface and to control chemically grown oxide on the wafer surface. Wafer cleaning is the most frequently repeated operation in IC manufacturing, and can be loosely divided into two groups: wet and dry methods. Liquid chemical cleaning processes are generally referred to as wet cleaning while dry cleaning processes use gas phase chemistry.

Since both wet etching and wet cleaning mainly use liquid chemicals, wet etching and wet cleaning also referred to as wet processing or wet chemistry process in the semiconductor production. Furthermore, since the wet chemistry is an essential processing and the most frequently repeated operation, it is always in need to improve etching result and cleaning result.

SUMMARY OF THE INVENTION

According to an aspect of the present invention, an apparatus for semiconductor wafer treatment is provided. The apparatus includes a wafer holding unit configured to receive a single wafer, at least a solution supply unit configured to apply a solution onto the wafer and an irradiation unit configured to emit irradiation to the wafer, the irradiation unit further including at least a plurality of first light sources configured to emit irradiation in far-infrared (hereinafter abbreviated as FIR) range and a plurality of second light sources configured to emit irradiation in ultraviolet (hereinafter abbreviated as UV) range.

According to an aspect of the present invention, a semiconductor wafer treatment is provided. The semiconductor wafer treatment includes following steps: A first treatment is performed to a single wafer. The wafer is exposed to irradiation. And a second treatment is performed by rotating the wafer and applying a solution onto the wafer.

According to the apparatus for semiconductor wafer treatment and the semiconductor wafer treatment provided by the present invention, the wet process is performed with or after exposing the wafer to the irradiation. Consequently, surface potential change is caused due to the irradiation and thus cleaning result and/or etching result is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-4 are schematic drawings for illustrating a semiconductor wafer treatment provided by a first preferred embodiment of the present invention, wherein FIG. 4 is a schematic drawing in a step subsequent to FIG. 3.

FIGS. 5-6 are schematic drawings for illustrating a semiconductor wafer treatment provided by a second preferred embodiment of the present invention, wherein FIG. 6 is a schematic drawing in a step subsequent to FIG. 5.

DETAILED DESCRIPTION

Figure 1:
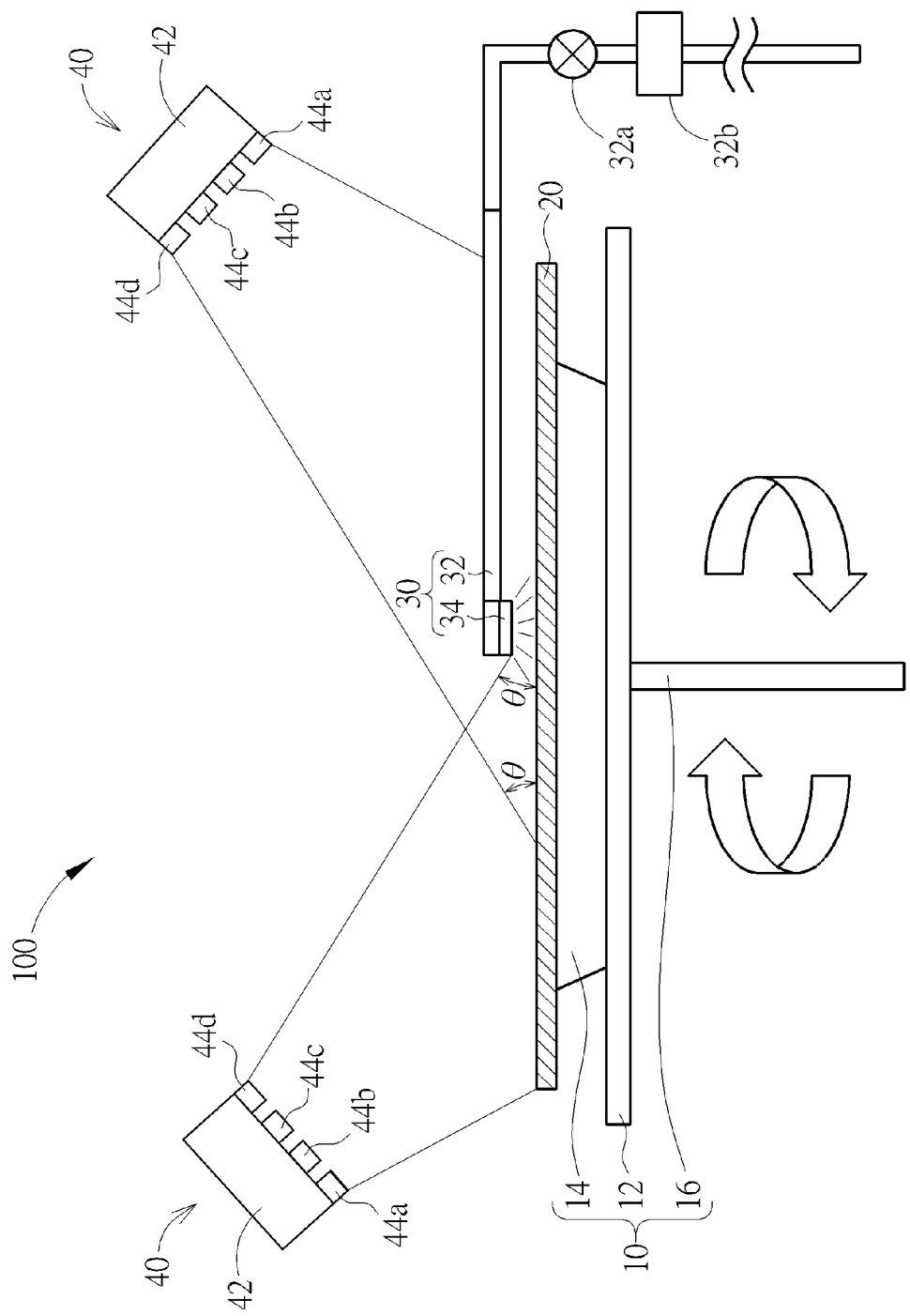
FIG. 1 is a schematic drawing for illustrating an apparatus for semiconductor treatment provided by preferred embodiment of the present invention.

Please refer to FIG. 1, which is a schematic drawing for illustrating an apparatus for semiconductor treatment provided by preferred embodiment of the present invention. According to the present invention, a single wafer wet processing chamber (not shown) can be used to wet etching/cleaning a wafer before and/or after a variety of wafer processes. As shown in FIG. 1, the apparatus for semiconductor wafer treatment 100 includes a wafer holding unit 10 configured to receive a single wafer 20. The wafer holding unit 10 includes a wafer holder 12 and a rotator 16. As shown in FIG. 1, the wafer holder 12 can further include an electrostatic chuck or a vacuum chuck 14. In some embodiments of the present invention, the wafer holder 12 can include a plurality of pins (not shown) installed, and the wafer 20 is held in between theses pins. Accordingly, the wafer holder 12 holds the wafer 20. The rotator 16 can be, for example but not limited to, a rotating shaft disposed on the center of the wafer holder 12. The rotator 16 rotates the wafer holder 12 and the held wafer 20, thus the held wafer 20 is rotated at a rotating speed of, for example but not limited to, about 300 to 500 rpm during coating of a chemical solution, and about 2000 to 3000 rpm during drying.

The apparatus for semiconductor wafer treatment 100 includes at least a solution supply unit 30. In detail, the solution supply unit 30 can include a solution line 32 and at least a nozzle 34. As shown in FIG. 1, the solution line 32 is connected to a chemical tank (not shown) for storing a solution or to an incidental apparatus through a valve 32a and a pump 32b. The nozzle(s) 34 can be capable of moving such as, for example, by pivot or by linear translation. The nozzle(s) 34 is moved from a waiting position to above the wafer holding unit 10. Additionally, the movements of the nozzle (s) 34 and the rotation of the rotator 16 may be performed in reverse order. That is, the rotator 16 can rotates counter-clockwise while the nozzle(s) 34 can pivot clockwise, but not limited to this. The solution supply unit 30 applies a solution onto the wafer 20, and the solution can be at least one of the following: ozone water, hydrogen water, DI water, $H_2O_2$, $CO_2$—$H_2O$, DI water having $O_2$ gas dissolved therein, $NH_4OH$, acetic acid, citric acid, $HNO_3$, HCl, $H_3PO_4$, hydrogen peroxide solutions, sulfuric acid, dilute hydrofluoric acid (hereinafter abbreviated as dHF) solution, tetramethylammonium hydroxide (hereinafter abbreviated as TMAH) solution, sulfuric-peroxide mixture (hereinafter abbreviated as SPM) cleaning solution, or standard clean 2 (SC2) solution, hydrofluoric acid+nitric acid+acetic acid (hereinafter abbreviated as HNA) solution, potassium hydroxide (hereinafter abbreviated as KOH), ethylene diamine pyrocatechol (hereinafter abbreviated as EDP) solution (also known as ethylene diamine-pyrocatechol-water, EPW solution) or other organic acids.

Figure 2:
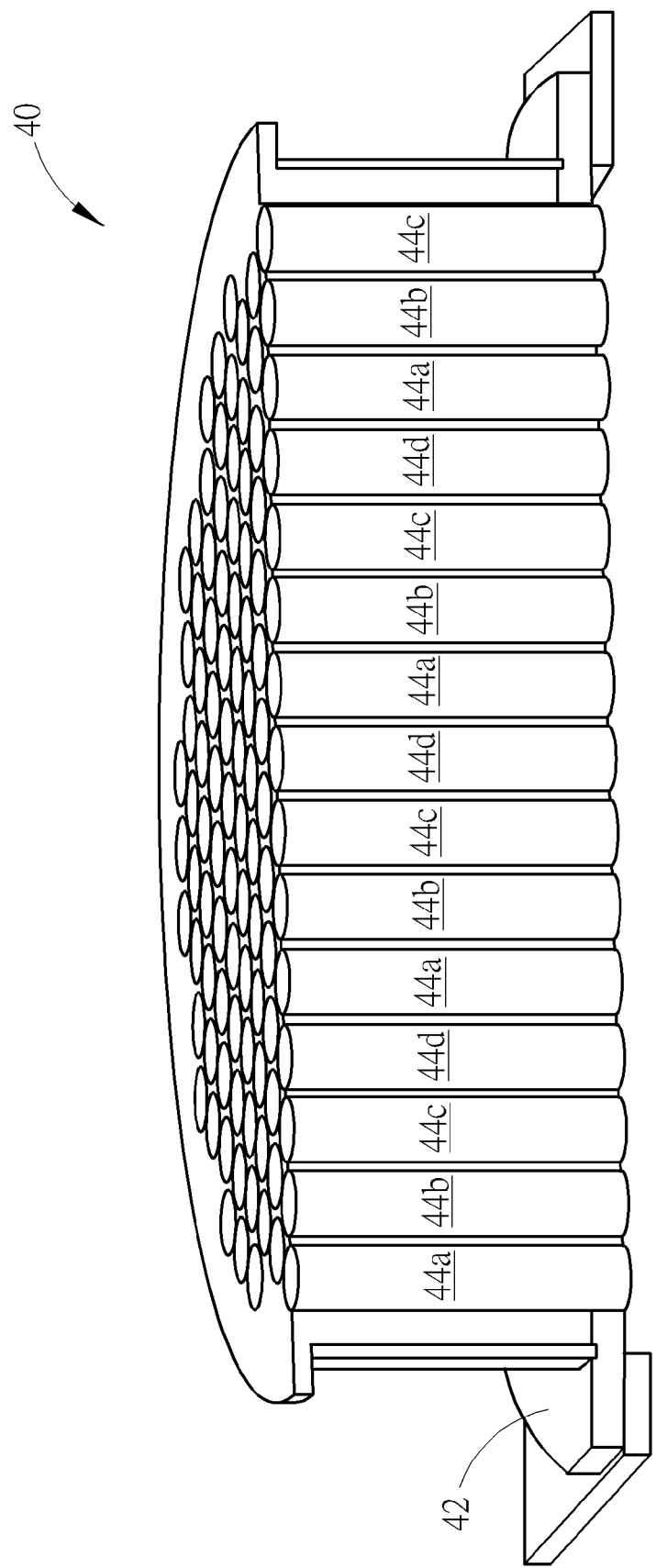
FIG. 2 is a schematic drawing for illustrating an irradiation unit provided by the preferred embodiment.

Please refer to FIG. 1 and FIG. 2, FIG. 2 is a schematic drawing for illustrating an irradiation unit provided by the preferred embodiment. The apparatus for semiconductor wafer treatment 100 further includes an irradiation unit 40. The irradiation unit 40 includes a housing 42, a plurality of first light sources 44a configured in the housing 42 to emit irradiation in FIR range and a plurality of second light sources 44b configured in the housing 42 to emit irradiation in UV range. In some embodiments of the present invention, the irradiation unit 40 can selectively include a plurality of third light sources 44c configured in the housing 42 to emit irradiation in infrared (IR) range and a plurality of fourth light sources 44d configured in the housing 42 to emit irradiation invisible light range. In some embodiments of the present invention, the first to fourth light sources 44a-44d preferably include light-emitting diode (hereinafter abbreviated as LED) bulbs, LED lamps, or LED bars, but not limited to this. The first light sources 44a, the second light sources 44b, the third light sources 44c, and the fourth light sources 44d can include a beehive arrangement with the light sources 44a-44d respectively disposed in the beehive openings, or can be arranged in an array as shown in FIG. 2. As shown in FIG. 1, the irradiation unit 40 is disposed above the wafer holding unit 10 and the held wafer 20. Additionally, the irradiation unit 40 can be moved from a waiting position to above the wafer holding unit 10 and the held wafer 20 by a driving mechanism (not shown). The irradiation unit 40 emits irradiation to the wafer 20. Specifically, the irradiation unit 40 can alternatively emit irradiation in FIR range or irradiation in UV range by turning on the first light sources 44a or alternatively the second light sources 44b. Or, the irradiation unit 40 can emit irradiation in IR range by turning on the third light sources 44c. Still, the irradiation unit 40 can emit irradiation in the visible light range by turning on the fourth light sources 44d. However, the irradiation unit 40 can concurrently emit irradiation in FIR range and irradiation in UV range by turning on both of the first light sources 44a and the second light sources 44b. Briefly speaking, the irradiation unit 40 can emit variable irradiation in desired range (s) by turning on the light sources 44a-44d individually. Additionally, the irradiation unit 40 can provide variable power by current control. Furthermore, the irradiation and a surface of the wafer 20 include an included angle θ, and the included angle θ is not equal to 90° for avoiding chemical damage, as shown in FIG. 1.

Please refer to FIG. 1 again. In some embodiments of the present invention, the solution supply unit 30 applies the solution onto the wafer 20 simultaneously with emitting irradiation to the wafer 20. In other embodiments of the present invention, the solution supply unit 30 applies the solution onto the wafer 20 after emitting irradiation to the wafer 20. Briefly speaking, the apparatus for semiconductor wafer treatment 100 includes multiple functionalities.

Additionally, the apparatus for semiconductor wafer treatment 100 still includes at least an outlet unit (not shown) for draining out the solutions. In some embodiments of the present invention, the chuck 14 can be vertically and linearly moved in the camber. In some embodiments of the present invention, the outlet unit is vertically moved. In still some embodiments of the present invention, lines for connecting the outlet unit and the solution supply unit 30 are able to be adjusted depending on different requirements.

Figure 3:
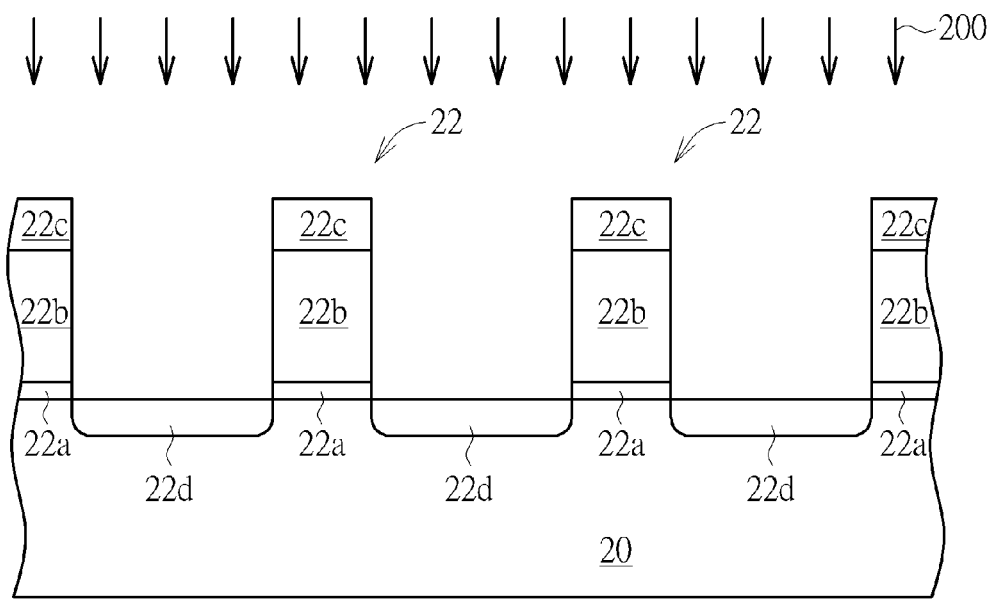
Figure 4:
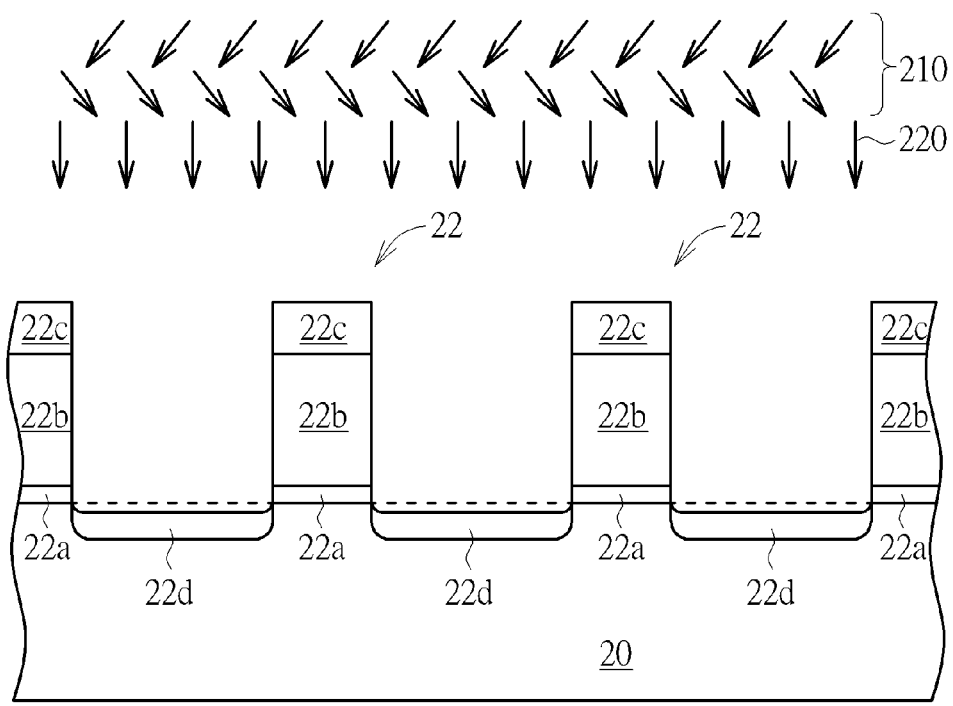

Please refer to FIGS. 3-4, which are schematic drawings for illustrating a semiconductor wafer treatment provided by a first preferred embodiment of the present invention. As mentioned above, the apparatus for semiconductor wafer treatment 100 is able to be used to wet etching/cleaning a wafer before and/or after a variety of wafer processes. According to the preferred embodiment, a first treatment 200 is performed to a single wafer 20, and the first treatment 200 includes an ion implantation such as a lightly-doped drain (hereinafter abbreviated as LDD) ion implantation as shown in FIG. 3. In detail, a wafer 20 is provided, and at least a gate structure 22 is formed thereon. The gate structure 22 can include, for example but not limited to, a gate dielectric layer 22a, a gate conductive layer 22b, and a patterned hard mask 22c. In some embodiments of the present invention, the gate structure 22 can include other elements such as cap layer, but not limited to this. Next, a patterned photoresist (not shown) is formed on the wafer 20 for protecting regions (not shown) from ion implantation and followed by performing the first treatment 200, that is the LDD ion implantation. Consequently, LDDs 22d are formed in the wafer 20 at two sides of the gate structure 22 as shown in FIG. 3.

Please refer to FIG. 4. Subsequently, the wafer 20 is transferred into the apparatus for semiconductor wafer treatment 100 as mentioned above. In some embodiments of the present invention, the wafer 20 is exposed to the irradiation 210 then a second treatment 220 is performed. In other embodiments of the present invention, wafer 20 is exposed to the irradiation 210 simultaneously with performing the second treatment 220. Wavelength used in the irradiation 210 can be from 400 nm to 940 nm, but not limited to this. Preferably, the irradiation 210 is in UV range or in a range from FIR to visible light. According to the preferred embodiment, the second treatment 220 is a post-LDD cleaning process used to remove the abovementioned patterned photoresist and to wash away residual organic materials. Accordingly, SPM cleaning solution, which is the most common chemistry used for front end of line (FEOL) photoresist removal and post-resist strip cleaning, is used. And the second treatment 220 is to applying SPM cleaning solution onto the wafer 20. Inventors of the present invention discovered that by irradiating the surface of the wafer 20 during or before applying SPM cleaning solution, surface potential is changed. Inventors of the present invention discovered that by irradiating the surface of the wafer 20, the photogenerated holes are driven to the silicon/solution intersurface while the photogenerated electrons are driven into the bulk and the un-irradiated surface. Consequently, reaction between silicon and SPM cleaning solution is reduced due to the high surface hole concentration.

Inventors of the present invention discovered that by irradiating the wafer surface during or before applying the solution, silicon loss is reduced from 30 Å to 10 Å. It is noteworthy that for emphasizing silicon loss, original wafer surface is depicted by the dotted line in FIG. 4. According to the apparatus for semiconductor wafer treatment 100 and the semiconductor wafer treatment provided by the present invention, the wet process (the wet cleaning) 220 is performed with or after exposing the wafer 20 to the irradiation 210. Consequently, surface potential change is caused due to the irradiation and thus cleaning result is improved. Additionally, volcano defect can also be reduced due to irradiation.

Figure 5:
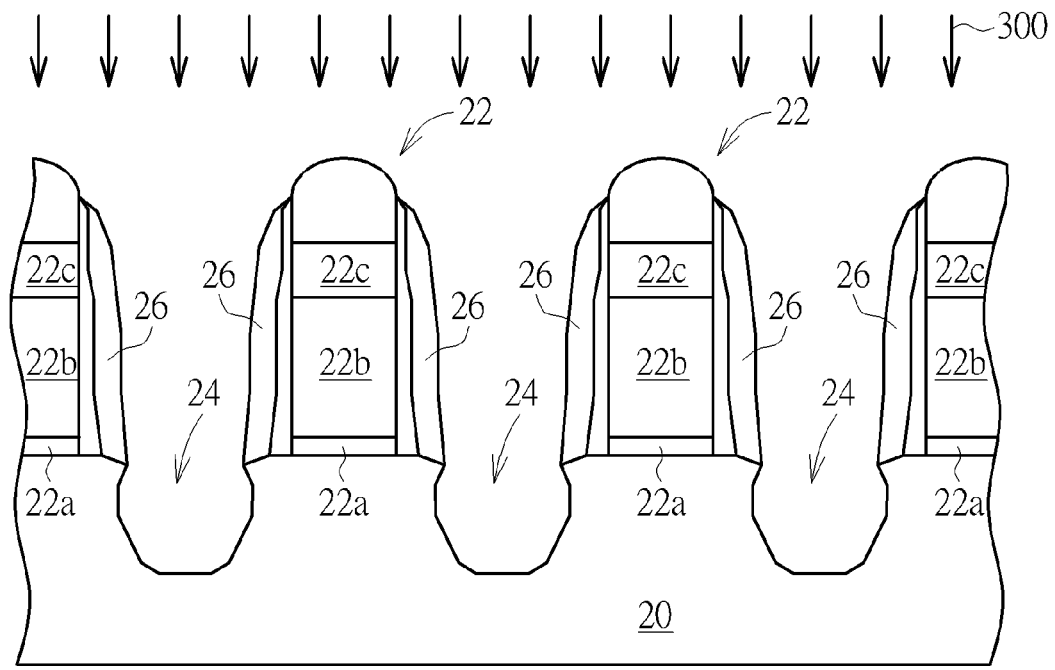
Figure 6:
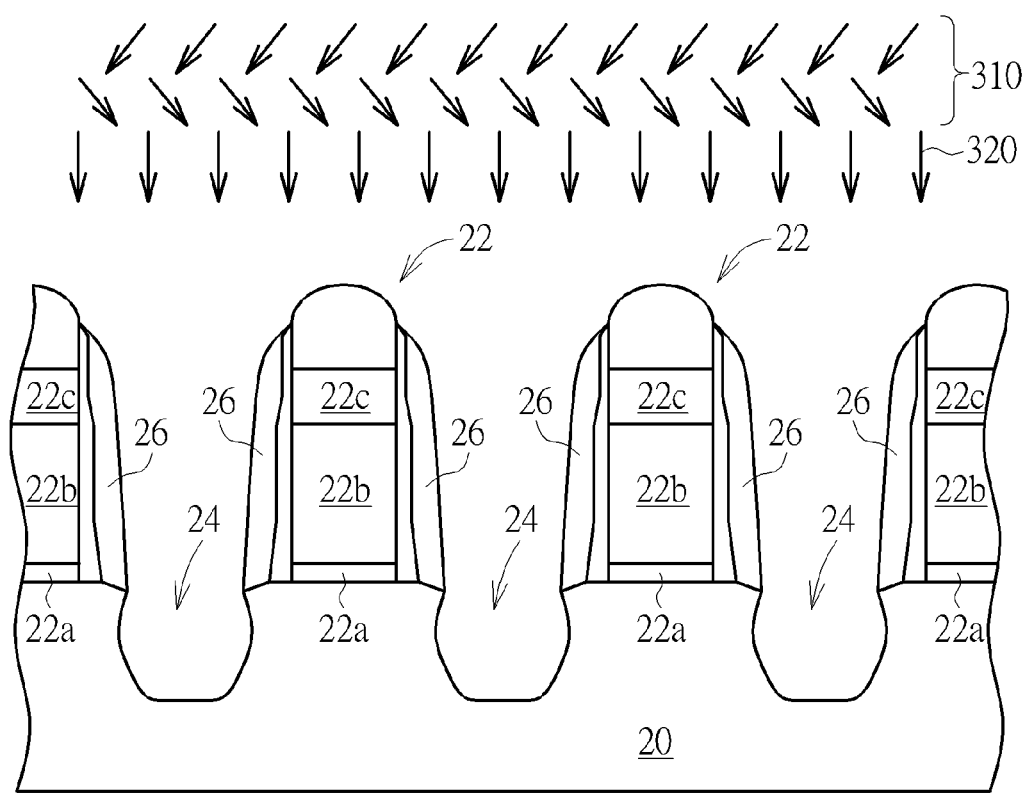

Please refer to FIGS. 5-6, which are schematic drawings for illustrating a semiconductor wafer treatment provided by a second preferred embodiment of the present invention. As mentioned above, the apparatus for semiconductor wafer treatment 100 is able to be used to wet etching/cleaning a wafer before and/or after a variety of wafer processes. According to the preferred embodiment, a first treatment 300 is performed to a single wafer 20. It is well-known that in the strained-silicon approach, recesses are required so that the stressors are formed therein to provide effective stress to the channel region. Therefore, after forming the gate structures 22, the LDDs (not shown in FIG. 5), the spacers 26, and/or disposal spacers on sidewalls of the gate structures 22, the first treatment 300 (that is a dry etching process in the preferred embodiment) is performed to form at least a recess 24 in the substrate 20 at two sides of the gate structures 22 as shown in FIG. 5.

Please refer to FIG. 6. Subsequently, the wafer 20 is transferred into the apparatus for semiconductor wafer treatment 100 as mentioned above. However, the first treatment 300 and following performed steps can be all performed in the apparatus for semiconductor wafer treatment 100 without transferring. In some embodiments of the present invention, the wafer 20 is exposed to the irradiation 310 then a second treatment 320 is performed. In other embodiments of the present invention, wafer 20 is exposed to the irradiation 310 simultaneously with performing the second treatment 320. Wavelength used in the irradiation 310 can be from 400 nm to 940 nm, but not limited to this. Preferably the irradiation 310 is in UV range or in a range from FIR to visible light. According to the preferred embodiment, the second treatment 320 is a cleaning process used to remove the residues and native oxide of Si generated by the dry etching process. Therefore the second treatment 320 is to apply a dHF solution onto the wafer 20. Inventors of the present invention discovered that by irradiating the surface of the wafer 20 during or before applying the dHF solution, surface potential is changed. Inventors of the present invention discovered that by irradiating the surface of the wafer 20, the photogenerated holes are driven to the silicon/solution surface while the photogenerated electrons are driven into the bulk and the un-irradiated surface. Consequently, reaction between silicon and the dHF solution is reduced because the high surface hole concentration resists H+ attack. More important, this surface potential change not only occurs at Si surface, but also occurs at SiN and SiO, which are conventionally used to form protecting layer, spacer 26, and/or disposal spacers 26 and used to protect the gate structures 22 during the dry etching process.

Inventors of the present invention discovered that by irradiating the wafer surface during or before applying the solution, silicon loss is reduced from 20 Å to about 17 Å, SiO loss is reduced from 102 Å to about 76 Å, and SiN loss is reduced from 78 Å to about 50 Å. In conclusion, adverse impacts to the device profile from the wet cleaning process are diminished. According to the apparatus for semiconductor wafer treatment 100 and the semiconductor wafer treatment provided by the present invention, the wet process (the wet cleaning) 320 is performed with or after exposing the wafer 20 to the irradiation 310. Consequently, surface potential change is caused due to the irradiation 310, and thus cleaning result is improved while impacts to the device profile are diminished.

Figure 7:
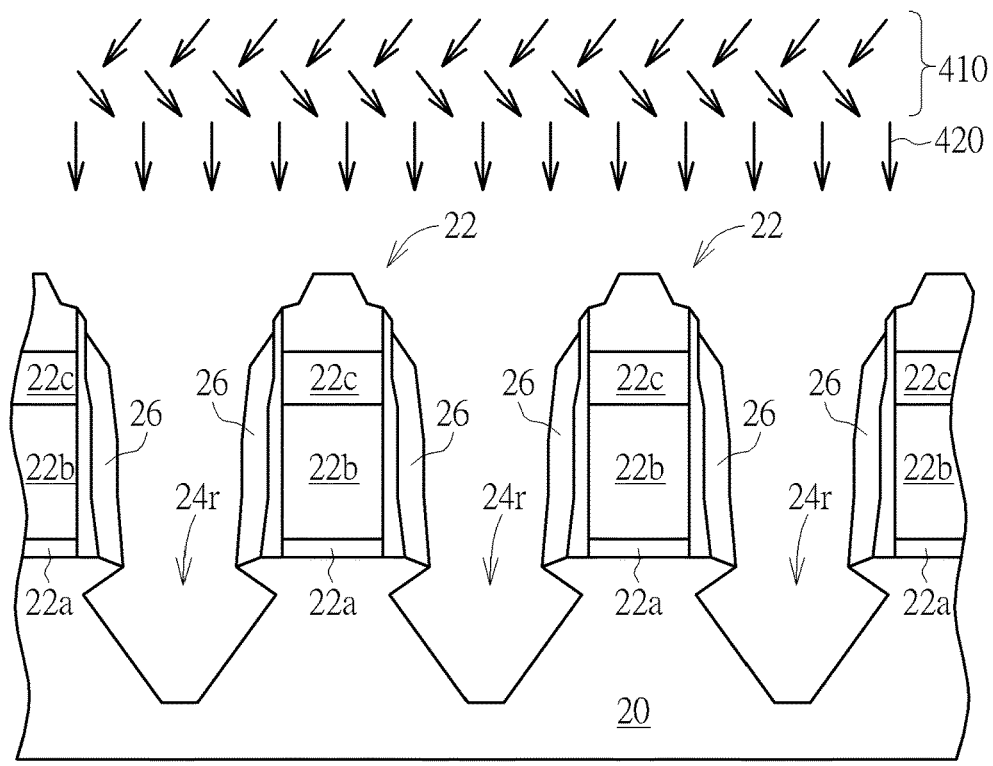
FIG. 7 is a schematic drawing for illustrating a semiconductor wafer treatment provided by a third preferred embodiment of the present invention.

Please refer to FIGS. 6-7, which are schematic drawings for illustrating a semiconductor wafer treatment provided by a third preferred embodiment of the present invention. As mentioned above, the apparatus for semiconductor wafer treatment 100 is able to be used to wet etching/cleaning a wafer before and/or after a variety of wafer processes. It is noteworthy that according to the preferred embodiment, the abovementioned dHF cleaning process 320 is referred to the first treatment 320. In other words, the first treatment can include a cleaning process such as, for example but not limited to, the abovementioned dHF cleaning process 320. In other words, exposing the wafer 20 to the irradiation 310 can be performed simultaneously with or before performing the first treatment 320. As shown in FIG. 6, the first treatment (that is the dHF cleaning process) 320 is performed to remove native oxide of Si and any other residues after the dry etching process. However, the recesses 24 formed by the dry etching process is an unready recess due to its misshapen. Therefore another etching process is required to obtain a recess with desirable shape.

Please refer to FIG. 7. Subsequently, the wafer 20 is transferred into the apparatus for semiconductor wafer treatment 100 as mentioned above. However, the first treatment 320 and following performed steps can be all performed in the apparatus for semiconductor wafer treatment 100 without transferring. In some embodiments of the present invention, the wafer 20 is exposed to the irradiation 410 then a second treatment 420 is performed. In other embodiments of the present invention, wafer 20 is exposed to the irradiation 410 simultaneously with performing the second treatment 420. Wavelength used in the irradiation 410 can be from 400 nm to 940 nm, but not limited to this. Preferably, the irradiation 410 is in UV range or in a range from FIR to visible light. According to the preferred embodiment, the second treatment 420 is a wet etching process used to etch Si in order to obtain shape suitable for stressors. Therefore, the second treatment 420 is to apply a TMAH solution onto the wafer 20. Inventors of the present invention discovered that by irradiating the surface of the wafer 20 during or before applying the TMAH solution, surface potential is changed. As mentioned above, by irradiating the surface of the wafer 20, the photogenerated holes are driven to the silicon/solution surface while the photogenerated electrons are driven into the bulk and the un-irradiated surface. Consequently, reaction between silicon and the TMAH solution is improved because the high surface hole concentration assists OH− attack. Consequently, a recess 24r with desirable diamond shape is obtained as shown in FIG. 7.

Inventors of the present invention discovered that by irradiating the wafer surface during or before applying the solution onto, <100> etching rate is improved to about 133% and <110> etching rate is improved to about 119%. More important, such improvement is achieved with reducing process period: the process period is reduced from over 300 seconds to less than 200 seconds. Additionally, TMAH usage is deducted and thus process cost is reduced. According to the apparatus for semiconductor wafer treatment 100 and the semiconductor wafer treatment provided by the present invention, the wet process (the wet etching) 420 is performed with or after exposing the wafer 20 to the irradiation 410. Consequently, surface potential change is caused due to the irradiation 410 and thus etching result is improved.

Additionally, those skilled in the art would easily realize that not only the TMAH solution can be used in the wet etching process, but also the HNA solution, the KOH solution, and the EDP solution can be used in Si wet etching.

Figure 8:
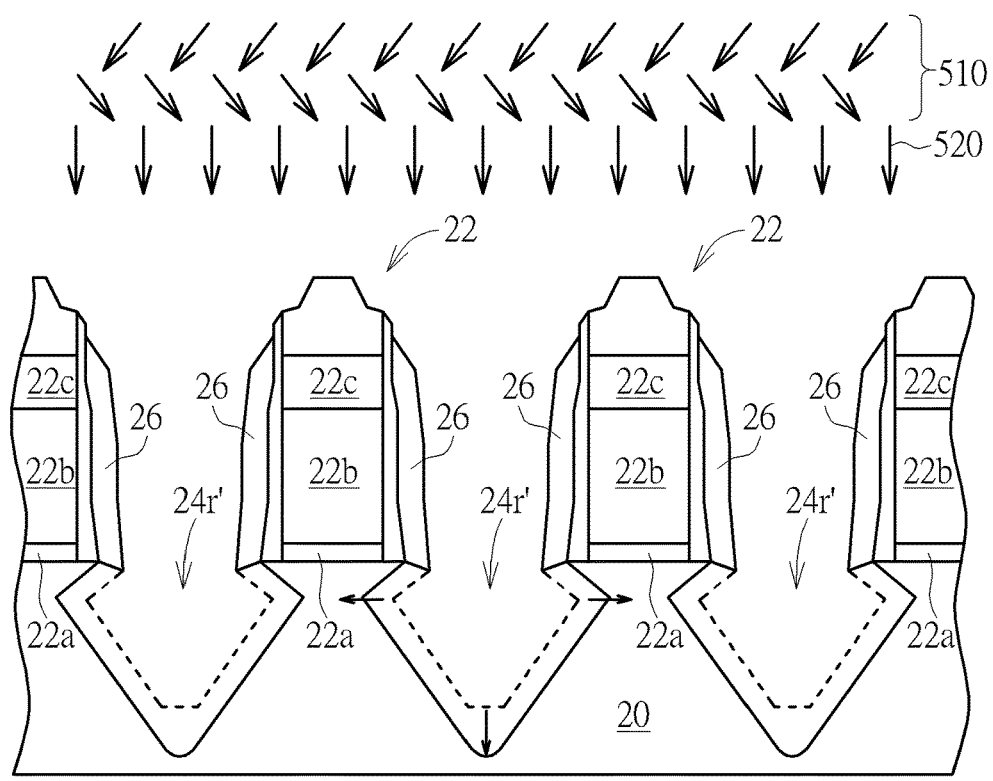
FIG. 8 is a schematic drawing for illustrating a semiconductor wafer treatment provided by a fourth preferred embodiment of the present invention.

Please refer to FIGS. 7-8, which are schematic drawings for illustrating a semiconductor wafer treatment provided by a fourth preferred embodiment of the present invention. As mentioned above, the apparatus for semiconductor wafer treatment 100 is able to be used to wet etching/cleaning a wafer before and/or after a variety of wafer processes. It is noteworthy that according to the preferred embodiment, the abovementioned TMAH etching 420 is referred to the first treatment. In other words, the first treatment can include a wet etching process such as, for example but not limited to, the abovementioned TMAH etching process 420. As mentioned above, exposing the wafer 20 to the irradiation 410 can be performed simultaneously with or before performing the first treatment 420. As shown in FIG. 7, the first treatment (that is the TMAH etching process) 420 is performed to obtain the recess 24r with desirable diamond shape after the dry etching process 300 and the dHF cleaning process 320. In some embodiments of the present invention, the recess 24r does not include desirable size instead of the wanted shape is obtained. Therefore still another etching process is required to obtain a recess with desirable size.

Please refer to FIG. 8. Subsequently, the wafer 20 can be transferred into the apparatus for semiconductor wafer treatment 100. However, the first treatment 420 and following performed steps can be all performed in the apparatus for semiconductor wafer treatment 100 without transferring. In some embodiments of the present invention, the wafer 20 is exposed to the irradiation 510 then a second treatment 520 is performed. In other embodiments of the present invention, wafer 20 is exposed to the irradiation 510 simultaneously with performing the second treatment 520. Wavelength used in the irradiation 510 can be from 400 nm to 940 nm, but not limited to this. Preferably, the irradiation 510 is in UV range or in a range from FIR to visible light. According to the preferred embodiment, the second treatment 520 is a wet etching process used to etch Si in order to obtain size suitable for stressors. Therefore, the second treatment 520 is to apply a TMAH solution onto the wafer 20. As mentioned above, by irradiating the surface of the wafer 20 during or before applying the TMAH solution, surface potential is changed. The photogenerated holes are driven to the silicon/solution surface while the photogenerated electrons are driven into the bulk and the un-irradiated surface. Consequently, reaction between silicon and the TMAH solution is improved because the high surface hole concentration assists OH− attack. Consequently, a recess 24r' with desirable diamond shape and desirable size is obtained as shown in FIG. 8. In order to clarifying the etching result between TMAH etching 420 and TMAH etching 520, the recess 24r obtained by TMAH etching 420 is depicted by the dotted line while the recess 24r' obtained by TMAH etching 520 is depicted by the bold line as shown in FIG. 8.

As mentioned above, by irradiating the wafer surface during or before applying the solution, <100> etching rate is improved to about 133% and <110> etching rate is improved to about 119%. More important, such improvement is achieved with reducing process period. Additionally, TMAH usage is deducted and thus process cost is reduced. According to the apparatus for semiconductor wafer treatment 100 and the semiconductor wafer treatment provided by the present invention, the wet process (the wet etching) 520 is performed with or after exposing the wafer 20 to the irradiation 510. Consequently, surface potential change is caused due to the irradiation and thus etching result is improved.

According to the apparatus for semiconductor wafer treatment and the semiconductor wafer treatment provided by the present invention, the wet process (including the wet cleaning process and the wet etching process) is performed with or after exposing the wafer to the irradiation. Consequently, surface potential change is caused due to the irradiation and thus cleaning result and/or etching result is improved. Briefly speaking, by irradiating the wafer surface, surface potential is changed to resist H+ attacking and to assist OH− attacking. Therefore the etching/cleaning rate can be reduced or improved depending on the etchant/chemicals used. The apparatus for semiconductor wafer treatment and the semiconductor wafer treatment provided by the present invention therefore obtains improved applicability and functionality. Additionally, for the OH− attacking chemicals, since the etching rate is improved due to the altered surface potential, chemical usages can be further deducted and thus process cost is consequently reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for semiconductor wafer treatment comprising:
   a wafer holding unit configured to receive a single wafer;
   at least a solution supply unit configured to apply a solution onto the wafer, wherein the solution applied to the wafer comprises a tetramethylammonium hydroxide (TMAH) solution, a sulfuric-peroxide mixture (SPM) cleaning solution, or a standard clean 2 (SC2) solution; and
   an irradiation unit configured to emit irradiation to the wafer, the irradiation unit further comprising at least a plurality of first light sources configured to emit irradiation in far-infrared (FIR) range, a plurality of second light sources configured to emit irradiation in ultra violet (UV) range, a plurality of third light sources configured to emit irradiation in infrared (IR) range and a plurality of fourth light sources configured to emit irradiation in visible light range, wherein the first light sources, the second light sources, the third light sources and the fourth light sources are alternately arranged in an array, and a surface potential of the wafer is changed by the irradiation emitted from the irradiation unit, wherein the solution supply unit is configured to apply the solution onto the wafer after or during emitting the irradiation to the wafer but not before emitting the irradiation to the wafer using the irradiation unit.

2. The apparatus for semiconductor wafer treatment according to claim 1, wherein the wafer holding unit further comprises:
   a wafer holder configured to hold the wafer; and
   a rotator configured to rotate the wafer holder and the held wafer.

3. The apparatus for semiconductor wafer treatment according to claim 1, wherein the irradiation unit is configured to alternatively emit the irradiation in FIR range or the irradiation in UV range.

4. The apparatus for semiconductor wafer treatment according to claim 1, wherein the irradiation unit is configured to concurrently emit the irradiation in FIR range and the irradiation in UV range.

5. The apparatus for semiconductor wafer treatment according to claim 1, wherein the irradiation and a surface of the wafer comprise an included angle, and the included angle is not equal to 90°.

6. The apparatus for semiconductor wafer treatment according to claim 1, wherein the solution supply unit is configured to apply the solution onto the wafer simultaneously with emitting the irradiation to the wafer.

7. The apparatus for semiconductor wafer treatment according to claim 1, wherein the solution supply unit is configured to apply the solution onto the wafer after emitting the irradiation to the wafer.

8. The apparatus for semiconductor wafer treatment according to claim 1, wherein the light sources of the irradiation unit consist of the first light sources in FIR range, the second light sources in UV range, the third light sources IR range, and the fourth light sources in visible light range.

9. The apparatus for semiconductor wafer treatment according to claim 1, wherein the irradiation unit includes at least one light source in each of FIR, UV, and visible light ranges, respectively.

10. An apparatus for semiconductor wafer treatment comprising:
a wafer holding unit configured to receive a single wafer;
at least a solution supply unit configured to apply a solution onto the wafer, wherein the solution applied to the wafer comprises a tetramethylammonium hydroxide (TMAH) solution, a sulfuric-peroxide mixture (SPM) cleaning solution, or a standard clean 2 (SC2) solution; and
an irradiation unit configured to emit irradiation to the wafer, the irradiation unit further comprising at least a plurality of first light sources configured to emit irradiation in far-infrared (FIR) range, a plurality of second light sources configured to emit irradiation in ultra violet (UV) range, a plurality of third light sources configured to emit irradiation in infrared (IR) range and a plurality of fourth light sources configured to emit irradiation in visible light range, wherein the first light sources, the second light sources, the third light sources and the fourth light sources are alternately arranged in an array, and a surface potential of the wafer is changed by the irradiation emitted from the irradiation unit, wherein the solution supply unit is configured to apply the solution onto the wafer only after emitting the irradiation to the wafer but not before or during emitting the irradiation to the wafer using the irradiation unit.

* * * * *